US012727441B2

(12) United States Patent
de Quilettes et al.

(10) Patent No.: US 12,727,441 B2
(45) Date of Patent: Sep. 1, 2026

(54) PREDICTION OF SEMICONDUCTOR DEVICE PERFORMANCE

(71) Applicant: Massachusetts Institute of Technology, Cambridge, MA (US)

(72) Inventors: Dane William de Quilettes, Somerville, MA (US); Brandon T. Motes, Rowlett, TX (US); Anthony T. Troupe, Cambridge, MA (US); Vladimir Bulovic, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 800 days.

(21) Appl. No.: 18/041,318

(22) PCT Filed: Aug. 13, 2021

(86) PCT No.: PCT/US2021/045875
§ 371 (c)(1),
(2) Date: Feb. 10, 2023

(87) PCT Pub. No.: WO2022/055658
PCT Pub. Date: Mar. 17, 2022

(65) Prior Publication Data
US 2023/0268236 A1 Aug. 24, 2023

Related U.S. Application Data

(60) Provisional application No. 63/075,481, filed on Sep. 8, 2020, provisional application No. 63/075,554, filed on Sep. 8, 2020.

(51) Int. Cl.
*H10P 74/00* (2026.01)
*G01N 21/95* (2006.01)
*H10P 74/20* (2026.01)

(52) U.S. Cl.
CPC ....... *H10P 74/238* (2026.01); *G01N 21/9501* (2013.01); *G01N 2201/06113* (2013.01)

(58) Field of Classification Search
CPC . H10P 74/238; H10P 74/203; G01N 21/9501; G01N 21/255
See application file for complete search history.

(56) References Cited

U.S. PATENT DOCUMENTS 4,930,865 A 6/1990 Dosmann
5,543,919 A 8/1996 Mumola
(Continued)

FOREIGN PATENT DOCUMENTS

CN 101074890 A 11/2007
EP 3 624 332 A1 3/2020
(Continued)

OTHER PUBLICATIONS

FluoMic Specifications, Compact Upright Widefield Photoluminescence Microscope; PicoQuant GmbH; accessible online at: https://www.picoquant.com/products/category/fluorescence-microscopes/fluomic-compact-upright-widefield-photoluminescence-microscope#specification; accessed: Feb. 24, 2025; 2 pages. (Year: 2025).*
(Continued)

*Primary Examiner* — Brian W Wathen
(74) *Attorney, Agent, or Firm* — Daly, Crowley, Mofford & Durkee, LLP

(57) ABSTRACT

An example methodology implementing the disclosed techniques includes receiving a plurality of measured semiconductor properties of one or more partially completed semiconductor devices, determining a measure of short circuit current density ($J_{SC}$) of each of the one or more partially completed semiconductor devices, the $J_{SC}$, measure based on a measure of semiconductor diffusion length ($L_D$) and a
(Continued)

measure of thickness, and determining a current voltage relationship of each of the one or more partially completed semiconductor devices. The method also includes calculating a current voltage (JV) curve based on the $J_{SC}$, measure and the current voltage relationship of each of the one or more partially completed semiconductor devices, wherein the JV curve provides an indication of maximum achievable power point ($P_{max}$) and open circuit voltage ($V_{oc}$) of a semiconductor device completed from the one or more partially completed semiconductor devices, and determining a predicted performance characteristic of the semiconductor device.

17 Claims, 8 Drawing Sheets

(56) References Cited

U.S. PATENT DOCUMENTS

| | | | | |
|---|---|---|---|---|
| 6,693,664 | B2 | 2/2004 | Neumann | |
| 7,154,607 | B2 | 12/2006 | Hendrix et al. | |
| 8,182,763 | B2 | 5/2012 | Duffy et al. | |
| 8,396,701 | B2 | 3/2013 | Ludwig | |
| 9,075,012 | B2 | 7/2015 | Repins et al. | |
| 9,217,855 | B1 | 12/2015 | Clawges | |
| 9,633,876 | B2 | 4/2017 | Timans et al. | |
| 10,502,687 | B2 | 12/2019 | Trupke et al. | |
| 2002/0030491 | A1 | 3/2002 | Kose | |
| 2007/0205765 | A1* | 9/2007 | Bailey, III | G01B 7/105 324/230 |
| 2009/0051914 | A1 | 2/2009 | Trupke et al. | |
| 2010/0006785 | A1 | 1/2010 | Finarov | |
| 2011/0033957 | A1 | 2/2011 | Holden et al. | |
| 2011/0315204 | A1 | 12/2011 | Gleason et al. | |
| 2012/0004868 | A1* | 1/2012 | Fafard | H02S 50/10 702/58 |
| 2012/0156577 | A1 | 6/2012 | Bulovic et al. | |
| 2012/0326054 | A1 | 12/2012 | Meloni | |
| 2015/0027529 | A1 | 1/2015 | Barr et al. | |
| 2015/0285679 | A1 | 10/2015 | Kasiutsich et al. | |
| 2016/0281150 | A1 | 9/2016 | Rawlings et al. | |
| 2017/0248528 | A1 | 8/2017 | Blaine | |
| 2018/0067058 | A1 | 3/2018 | Horn | |
| 2018/0106735 | A1 | 4/2018 | Gellineau et al. | |
| 2019/0109252 | A1 | 4/2019 | Zhang et al. | |
| 2019/0154439 | A1 | 5/2019 | Binder | |
| 2020/0168801 | A1* | 5/2020 | Ko | H10K 30/30 |
| 2020/0343403 | A1* | 10/2020 | Heben | H10F 77/123 |
| 2020/0400578 | A1* | 12/2020 | Anderson | G01N 21/65 |
| 2023/0304944 | A1 | 9/2023 | Troupe et al. | |

FOREIGN PATENT DOCUMENTS

| | | |
|---|---|---|
| JP | 2006064441 | 3/2006 |
| JP | 2007311515 | 11/2007 |

OTHER PUBLICATIONS

BioTek Microplate Readers, Frequently Asked Questions; Agilent Technologies, Inc.; accessible online at: https://www.agilent.com/en/support/microplate-instrumentation/microplate-readers/microplate-reader-faqs; accessed: Feb. 20, 2025; 1 page (Year: 2025).*

Office Action dated Oct. 31, 2024, for U.S. Appl. No. 18/041,279; 18 pages.

PCT International Search Report and Written Opinion dated Nov. 26, 2021 for International Application No. PCT/US2021/045872; 10 Pages.

PCT International Search Report and Written Opinion dated Dec. 15, 2021 for International Application No. PCT/US2021/045875; 10 Pages.

Final Office Action dated Apr. 28, 2025 for U.S. Appl. No. 18/041,279; 16 pages.

Extended European Search Report dated Oct. 28, 2024, for European Patent Application No. 21867336.6; 12 pages.

Extended European Search Report dated Aug. 20, 2024 for European Application No. 21867335.8; 8 Pages.

Tseng et al., "Multimodal Characterization of Perovskite Materials Using the Horiba SMS-320 System: Integrating Raman, PL, and TRPL Spectroscopies"; Horiba; May 2024; 3 pages.

Oelsner et al., "Measuring steady-state and time-resolved photoluminescence from a positionable, micrometer-sized observation vol. with the FluoMic add-on"; PicoQuant GmbH; 2020; 6 pages.

"Agilent BioTek Cytation 7 Cell Imaging Multimode Reader"; Agilent Technologies, Inc.; Nov. 2024; 12 pages.

One SpectraMax, Endless Discoveries; Molecular Devices, LLC; accessible online at: https://info.moleculardevices.com/br/one-spectramax-endless-discoveries?cmp=701Rn0000076EtvlAE&utm_adgroup=NA-MPR-microplate&utm_campaignid=20819916666&utm_adgroupid=161918759688&utm_location=9002004&utm_keyword=microplate%20reader&utm_device=c&utm_placement=&utm_adpostion=&utm_network=g&utm_campaign=MD-GLO-BR-CC-PPC-Google-20240208-InfiniteDiscoveriesMMR&utm_medium=cpc&utm_source=adwords&utm_term=microplate%20reader&hsa_acc=4341129614&hsa_cam=20819916666&hsa_grp=161918759688&hsa_ad=683132148180&hsa_src=g&hsa_tgt=kwd-255666858&hsa_kw=microplate%20reader&hsa_mt=p&hsa_net=adwords&hsa_ver=3&gad_source=1&gbraid=0AAAAADyOIARFrZGBTDoWVNN5cSdmbn3kC&gclid=Cj0KCQiAvvO7BhC-ARIsAGFyToULW-wLvtfMdluQLP9hNI-ZPgKH_R56odYTRhgko6XGdTA19RLwINQaAosYEALw_wcB; accessed: Feb. 24, 2025; 2 pages.

BioTek Cytation Hybrid Multimode Reader, Multimode Microplate Readers; Agilent Technologies, Inc.; accessible online at: https://www.agilent.com/en/product/microplate-instrumentation/microplate-readers/multimode-microplate-readers/biotek-cytation-hybrid-multimode-reader-1623197; accessed: Feb. 24, 2025; 4 pages.

Office Action dated Oct. 31, 2024, for U.S. Appl. No. 18/041,279; Response filed Feb. 24, 2025; 17 pages.

European Rule 112(1) Communication dated May 30, 2025 for European Patent Application No. 21867336.6; 2 pages.

Response to European Rule 112(1) Communication dated May 30, 2025 for European Patent Application No. 21867336.6; Response filed Jul. 25, 2025; 23 pages.

Noting of loss of rights pursuant to Rule 112(1) EPC dated Mar. 21, 2025, for European Patent Application No. 21867335.8; 2 pages.

* cited by examiner

PREDICTION OF SEMICONDUCTOR DEVICE PERFORMANCE

CROSS REFERENCE TO RELATED APPLICATIONS

This application is a National Stage Entry of International Application PCT/US2021/045875, filed on Aug. 13, 2021, which claims the benefit of U.S. Provisional Application 63/075,481, filed on Sep. 8, 2020 and U.S. Provisional Application 63/075,554, filed on Sep. 8, 2020. The entire contents of these applications are incorporated herein by reference.

BACKGROUND

Semiconductors used for electronic and optoelectronic applications are typically optimized using a top-down engineering approach, where a single device is built, tested, and afterwards studied to determine where improvements in performance can be made. Oftentimes, more than one device may be fabricated in order to obtain statistics or to compare different processing conditions. Unfortunately, this top-down optimization process is time-intensive, inefficient, and expensive.

SUMMARY

This Summary is provided to introduce a selection of concepts in simplified form that are further described below in the Detailed Description. This Summary is not intended to identify key or essential features or combinations of the claimed subject matter, nor is it intended to be used to limit the scope of the claimed subject matter.

The concepts, systems, and techniques described herein are directed toward prediction of theoretical performance limits of fully fabricated semiconductor devices during or throughout a semiconductor device fabrication process. The semiconductor devices include optoelectronic devices, such as, without limitation, solar cells, light-emitting diodes (LEDs), integrated circuits, photodetectors, and lasers. This prediction is accomplished using a series of specific semiconductor properties measured during the semiconductor device fabrication process. These measured semiconductor properties are input to one or more device models (e.g., course device model, medium device model, and/or fine device model) that predict the theoretical performance limits of a fully fabricated semiconductor device.

In accordance with one example embodiment provided to illustrate the broader concepts, systems, and techniques described herein, a method may include receiving a plurality of measured semiconductor properties of one or more partially completed semiconductor devices, determining a measure of short circuit current density ($J_{SC}$) of each of the one or more partially completed semiconductor devices, the $J_{SC}$ measure based on a measure of semiconductor diffusion length ($L_D$) and a measure of thickness, and determining a current voltage relationship of each of the one or more partially completed semiconductor devices. The method may also include calculating a current voltage (JV) curve based on the $J_{SC}$ measure and the current voltage relationship of each of the one or more partially completed semiconductor devices, wherein the JV curve provides an indication of maximum achievable power point ($P_{max}$) and open circuit voltage ($V_{oc}$) of a semiconductor device completed from the one or more partially completed semiconductor devices, and determining a predicted performance characteristic of the semiconductor device. The method may further include, in response to the predicted performance characteristic being within a range of threshold values, completing fabrication of the semiconductor device.

In some embodiments, the plurality of measured semiconductor properties comprises an absorptivity spectrum determined from a transmittance and reflectance measurement.

In some embodiments, the method may also include fitting a low energy bandtail of the absorptivity spectrum to extrapolate the data below the measurement noise floor.

In some embodiments, the current voltage relationship includes a measure of radiative saturation current density ($J_{0,rad}$) of each of the one or more partially completed semiconductor devices. The $J_{0,rad}$ measure is based on an extended data set comprised of two or more data sets.

In some embodiments, the current voltage relationship includes a measure of radiative saturation current density ($J_{0,rad}$) and a measure of non-radiative current density ($J_{0,nr}$) of each of the one or more partially completed semiconductor devices.

In some embodiments, the measure of $J_{0,rad}$ and the measure of $J_{0,nr}$ are based on a first-order, non-radiative recombination rate constant ($k_1$), a second-order, radiative recombination rate constant ($k_2$), a third-order, non-radiative recombination rate constant ($k_3$), an intrinsic carrier density ($n_i$), or any combination thereof.

In some embodiments, wherein the measure of $J_{0,rad}$ and the measure of $J_{0,nr}$ are further based on a total non-radiative recombination rate constant ($k_{tot}$).

In some embodiments, the method may also include, in response to the predicted performance characteristic not being within the range of threshold values, stopping fabrication of the semiconductor device.

In accordance with one example embodiment provided to illustrate the broader concepts, systems, and techniques described herein, a method may include receiving a plurality of measured semiconductor properties of one or more partially completed semiconductor devices, determining a measure of short circuit current density ($J_{SC}$) of each of the one or more partially completed semiconductor devices, and determining a current voltage relationship of each of the one or more partially completed semiconductor devices, wherein the current voltage relationship includes a measure of radiative saturation current density ($J_{0,rad}$) and a measure of non-radiative current density ($J_{0,nr}$) of each of the one or more partially completed semiconductor devices. The method may also include calculating a current voltage (JV) curve based on the $J_{SC}$ measure and the current voltage relationship of each of the one or more partially completed semiconductor devices, wherein the JV curve provides an indication of maximum achievable power point ($P_{max}$) and open circuit voltage ($V_{oc}$) of a semiconductor device completed from the one or more partially completed semiconductor devices, and determining a predicted performance characteristic of the semiconductor device. The method may further include, in response to the predicted performance characteristic being within a range of threshold values, completing fabrication of the semiconductor device.

In some embodiments, the plurality of measured semiconductor properties comprises an absorptivity spectrum determined from a transmittance and reflectance measure.

In some embodiments, the method may also include fitting a low energy bandtail of the absorptivity spectrum to extrapolate the data below the measurement noise floor.

In some embodiments, the measure of $J_{0,rad}$ and the measure of $J_{0,nr}$ are based on a first-order, non-radiative recombination rate constant ($k_1$), a second-order, radiative recombination rate constant ($k_2$), a third-order, non-radiative recombination rate constant ($k_3$), an intrinsic carrier density ($n_i$), or any combination thereof.

In some embodiments, the measure of $J_{0,rad}$ and the measure of $J_{0,nr}$ are further based on a total non-radiative recombination rate constant ($k_{tot}$).

In some embodiments, the $J_{0,rad}$ measure is based on an extended data set comprised of two or more data sets.

In some embodiments, the $J_{SC}$ measure is based on a measure of semiconductor diffusion length ($L_D$) and a measure of thickness.

In some embodiments, the method may also include, in response to the predicted performance characteristic not being within the range of threshold values, stopping fabrication of the semiconductor device.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

Figure 1:
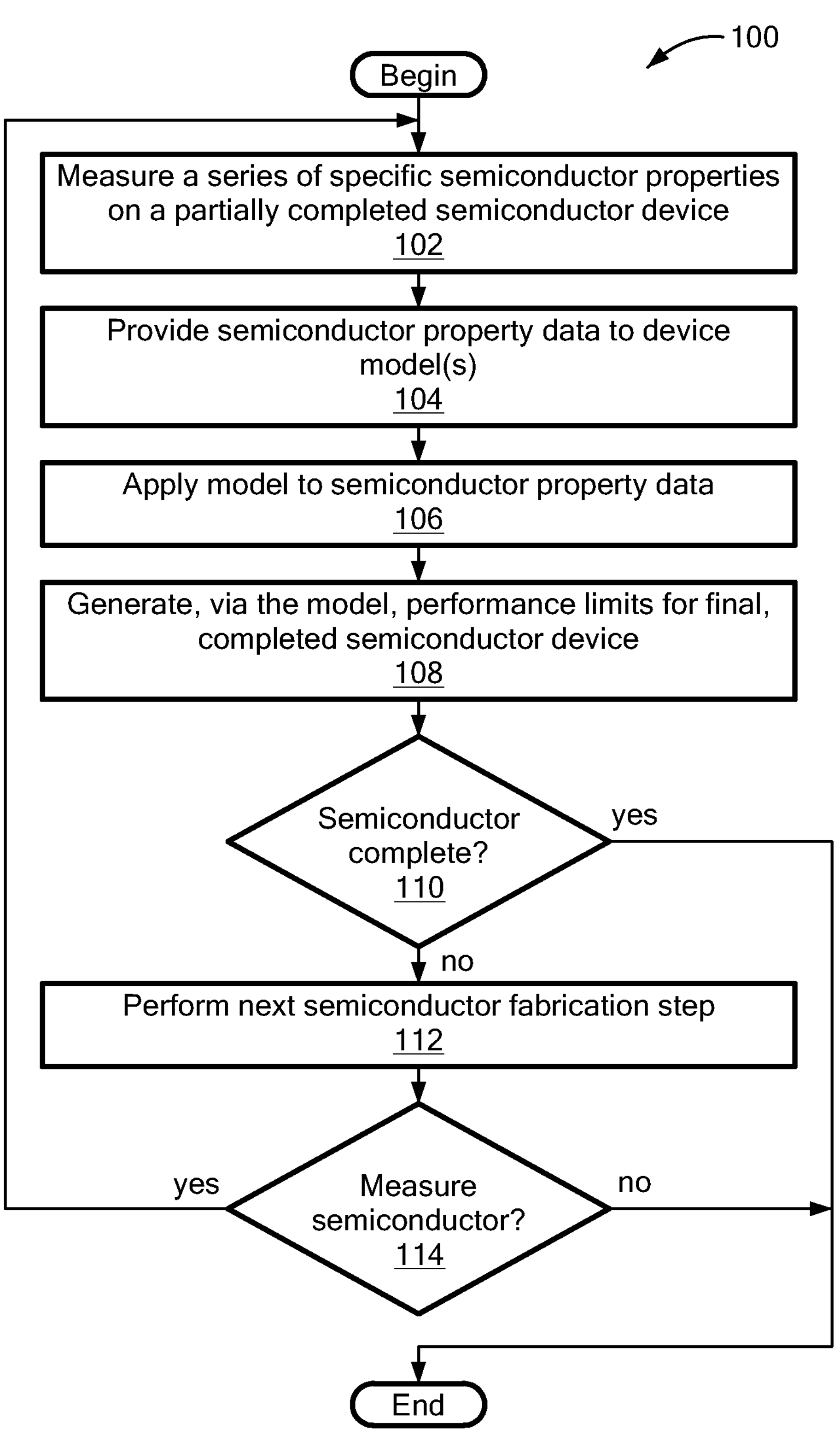
FIG. 1 is a flow diagram of an example process for analyzing semiconductor device performance during a semiconductor fabrication process, in accordance with an embodiment of the present disclosure.

Concepts, devices, and techniques are disclosed for predicting theoretical performance limits of fully fabricated semiconductors, such as, for example, solar cells, light-emitting diodes (LEDs), integrated circuits, photodetectors, lasers, and other optoelectronic devices. In embodiments, specific semiconductor properties of partially fabricated semiconductor device samples are measured during or throughout a semiconductor device fabrication process. The measured values of the specific semiconductor properties are input to one or more device models that predict the theoretical performance limits of a fully fabricated semiconductor device. The device models may include course device models, medium device models, and/or fine device models.

In some embodiments, the semiconductor properties can be determined from transmittance, reflectance, steady-state photoluminescence, and time-resolved photoluminescence measurements on a single or multiple partially fabricated semiconductor samples. Some or all of these semiconductor property measurements may be paired with data analysis to extract semiconductor parameters such as material recombination rate constants, interfacial recombination rates, surface recombination velocities, diffusion lengths, quantities related to the dielectric function (i.e., absorption coefficient), and sample thickness. These parameters may then be used as inputs into theoretical device models for a single or multiple samples. In some cases, the semiconductor properties are measured sequentially. In other cases, some or all of the semiconductor properties are measured simultaneously.

During the semiconductor device fabrication process, a sample (e.g., a partially fabricated semiconductor device) can be measured after the deposition of the photoactive layer as well as after the deposition of any additional layers on top of the material. The measurements can be performed using any suitable workpiece characterization system (sometimes referred to herein more simply as a "tool") capable of simultaneous or sequential measurements of semiconductor properties. For example, in the case of a solar cell, this process may involve deposition of a photoactive layer on top of an electronically insulating piece of glass, then subsequent deposition of an electron (n-type) or hole (p-type) transport layer (ETL and HTL, respectively), and finally the deposition of the metal contact to complete the device. Each sample architecture can be evaluated separately to understand the bulk energy losses within the semiconducting layer, at the charge transport layer/photoactive layer interfaces as well as through parasitic absorption (due to poor reflectivity) at the back metal contact.

The spectrally dependent information with regards to the photoactive layers of partially fabricated semiconductor device samples may be collected using a broadband light source (e.g., white light). The data sets of transmission and reflection spectra collected using the broadband light source can be used to determine the extinction coefficient, absorbance, and absorptivity of the sample using the following relation:

$$a(E) = 1 - \frac{T(E)}{1 - R(E)} \tag{1}$$

where a(E) is the calculated absorptivity spectrum, T(E) is the transmittance, and R(E) is the reflectance, all as a function of energy, E. A low energy bandtail of the absorptivity spectrum may be fitted to extrapolate the data below the measurement noise floor. Note that the absorptivity spectrum is often an important parameter used in optoelectronic device modeling.

The steady-state and time-resolved photoluminescence as well as the thickness of partially fabricated semiconductor device samples may be measured using a monochromatic light source, such as a laser. The monochromatic light source can operate in continuous wave (CW) or pulsed mode to make such measurements.

In some embodiments, multiple data sets can be collected simultaneously or sequentially to obtain inputs into theoretical device models. For example, semiconductor recombination rate constants such as $k_1$, $$k_2^{ext},$$

and $k_3$ which correspond to non-radiative, first-order (i.e., Shockley-Read-Hall); the external radiative, second order (i.e., bimolecular); and non-radiative, third-order (i.e., Auger) recombination rate constants can be measured with intensity dependent time-resolved PL or quantum efficiency measurements. These values, along with the absorptivity spectrum and the film thickness can be used as inputs into a detailed balance device model that predicts theoretical performance limit of a fully fabricated semiconductor device.

As will be appreciated in light of the various embodiments described herein, it has been realized that semiconductor recombination rate constants are important, and in some cases critical, properties that can be used to determine the rate at which both photoexcited species relax to the ground state and how quickly they convert to photons. For instance, it has been realized that both of these rates have broad implications to the operation of solar cells as well as light-emitting diodes, where solar cell power generation is determined by the rate of electron extraction and LED luminance is determined by the rate of photon emission.

In some embodiments, in order to extract the recombination rate constants, the time evolution of the carrier density, n(t), is simulated, and iteratively fit. The time-resolved photoluminescence decay traces can be globally fit using a differential equation of the form:

$$-\frac{dn(t)}{dt} = k_1 n + k_2^{ext} n^2 + k_3 n^3 \tag{2}$$

The intensity dependent time-resolved photoluminescence (PL) signal intensity is proportional to the radiative recombination rate, and can be calculated using the following equation:

$$PL \sim k_2^{ext} n^2 \tag{3}$$

where $$k_2^{ext}$$

is the external radiative, second-order recombination rate constant. Note that the fitting of the $k_1$, $k_2$, and $k_3$ variables can be constrained by measuring two or more photoluminescence data sets obtained at different laser intensities. The different laser intensities are then used to calculate the initial conditions for simulating time-dependent data. It has been realized that an accurate value of $k_2$ can be obtained by measuring time resolved photoluminescence data and then fitting it to a kinetic model to "extract" the value.

In accordance with some embodiments disclosed herein, a framework is used to simulate current voltage (JV) curves taking measured semiconductor parameters as inputs. Assuming the principle of superposition is upheld, the total current is the generation current minus the recombination currents. For example, in the case of solar cells, the generation current density at short circuit current density is denoted $J_{SC}$, the non-radiative Shockley-Read-Hall ($J_{SRH}$), the radiative saturation ($J_{0,rad}$), and the Auger ($J_{Auger}$) recombination currents.

$$J_{total}(V) = J_{sc} - J_{SRH}(V) - J_{0,rad}(V) - J_{Auger}(V) \tag{4}$$

Using detailed balance theory as well as Shockley's non-ideal diode equation, all of these terms ($J_{SC}$, $J_{SRH}$, $J_{0,rad}$, and $J_{Auger}$) may be defined using the following equations:

$$J_{SC} = q\int_0^{\infty} a(E)\phi_{AM1.5}(E)dE \tag{5}$$

$$n(V) = n_i e^{\frac{qV}{2kT}} \tag{6}$$

$$J_{SRH}(V) = qk_1 n(V)d \tag{7}$$

$$J_{0,rad}(V) = q\pi e^{\frac{qV}{kT}} \int_0^{\infty} a(E)\phi_{BB}(E)dE \tag{8}$$

or $$J_{0,rad}(V) = qk_2 n^2(V)d \tag{9}$$

$$J_{Auger}(V) = qk_3 n^3(V)d \tag{10}$$

where a(E) is the absorptivity, $\emptyset_{AM1.5}$(E) is the solar spectrum, $\emptyset_{BB}$(E) is the black body radiation of the solar cell, d is the photoactive layer thickness, and $n_i$, is the intrinsic carrier density.

Equation 5 assumes every photon that is absorbed is converted to current (i.e., infinite mobility). In order to account for finite mobilities and diffusion lengths, the model can also account for drift and diffusion. Using a measured diffusion length ($L_D$), the $J_{SC}$ can be recalculated based on these measurements as shown in the following equation:

$$J_{SC} = q\int_0^{\infty} \frac{\alpha(E)\phi_{AM1.5}(E)L_D}{1-\alpha(E)^2 L_D^2}\left(\tanh\left(\frac{d}{L_D}\right) - \alpha(E)L_D + \frac{\alpha(E)L_D e^{-\alpha(E)d}}{\cosh\left(\frac{d}{L_D}\right)}\right)dE \tag{11}$$

It has been realized that calculating the $J_{SC}$ based on the absorptivity spectrum, for example, using Equation 5 above (course model of the short circuit current density), provides a course prediction of $J_{SC}$. Calculating the $J_{SC}$ based on the extended data, for example, using Equation 5 above (medium model of the short circuit current density), provides a medium prediction of $J_{SC}$. Calculating the $J_{SC}$ based on the $L_D$ and a measure of thickness, for example, using Equation 11 above (fine model of the short circuit current density), provides a fine prediction of $J_{SC}$.

With respect to the current voltage relationship, it has been realized that calculating the $J_{0,rad}$ based on the absorptivity spectrum, for example, using Equation 8 above (course model of the current voltage relationship), provides a course prediction of the current voltage relationship. Calculating the $J_{0,rad}$ based on the extended data, for example, using Equation 8 above (medium model of the current voltage relationship), provides a medium prediction of the current voltage relationship. Calculating the $J_{0,rad}$ and the non-radiative current density ($J_{0,nr}$) based on $k_1$, $k_2$, $k_3$, $n_i$, or any combination thereof, using, for example, Equations 7, 9, and 10 above (fine model of the current voltage relationship), provides a fine prediction of the current voltage relationship. It has also been realized that a total non-radiative recombination rate constant ($k_{tot}$), which also accounts for additional nonradiative recombination at materials interfaces and outside the semiconducting layer, may be included in the calculation of the $J_{0,rad}$ and $J_{0,nr}$ in the fine model to provide a fine prediction of the current voltage relationship.

As will be appreciated in light of this disclosure, the models serve as a foundation to understand the inner workings of different material systems. Note that the models can take into consideration other factors such as series and shunt resistances.

The experimental approach combined with modeling disclosed herein can be used to calculate the theoretical limits of light-emitting devices, such as light-emitting diodes (LEDs). The internal LED quantum efficiency can be calculated by taking the ratio of the radiative recombination pathways over the total recombination currents, as shown in the following equation:

$$Q_i^{lum}(V) = \frac{J_0^{rad,int}(V)}{J_{SRH}(V) + J_0^{rad,int}(V) + J_{Auger}(V)} \tag{12}$$

The external LED quantum efficiency can be calculated by factoring in the probability of escape ($P_{esc}$) as well as a geometric series which accounts for photon recycling. Again, these calculations take into account the real optical response of the device using measurements of transmission and reflection from the transmittance and reflection spectra.

$$Q_e^{LED}(V) = \frac{P_{esc} Q_i^{lum}(V)}{1 - Q_i^{lum}(V)(1 - P_{esc})} \tag{13}$$

$$P_{esc} = \frac{J_0^{rad,ext}}{J_0^{rad,int}} \tag{14}$$

Equation 13 can be used to calculate the external luminescence quantum efficiency, $$Q_e^{LED}(V),$$

of the light emitting device taking into account emission and re-absorption events (photon-recycling) through the geometric series.

$$Q_e^{LED}(V)$$

is dependent on the internal luminescence quantum efficiency and the probability of photons escaping from the device ($P_{esc}$), which is defined as the external radiative saturation current divided by the internal radiative saturation current as shown in Equation 14.

FIG. 1 is a flow diagram showing illustrative processing that can be implemented within a system for fabricating semiconductors. Rectangular elements (typified by element 102 in FIG. 1), denoted as "processing blocks," represent computer software instructions or groups of instructions. Diamond shaped elements (typified by element 110 in FIG. 1), denoted as "decision blocks," represent computer software instructions, or groups of instructions, which affect the execution of the computer software instructions represented by the processing blocks. Alternatively, the processing and decision blocks may represent steps performed by functionally equivalent circuits such as a digital signal processor circuit or an application specific integrated circuit. The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated, the particular sequence of blocks described is illustrative only and can be varied without departing from the spirit of the concepts, structures, and techniques described. Thus, unless otherwise stated the blocks described below are unordered meaning that, when possible, the functions represented by the blocks can be performed in any convenient or desirable order.

Thus, the embodiments described herein can be implemented in various forms of hardware, software, firmware, or special purpose processors. For example, in one embodiment, a non-transitory computer readable medium includes instructions encoded thereon that, when executed by one or more processors, cause aspects of watermark system 504 described herein to be implemented. The instructions can be encoded using any suitable programming language, such as C, C++, object-oriented C, Java, JavaScript, Visual Basic .NET, BASIC, Scala, or alternatively, using custom or proprietary instruction sets. Such instructions can be provided in the form of one or more computer software applications or applets that are tangibly embodied on a memory device, and that can be executed by a computer having any suitable architecture. In one embodiment, the system can be hosted on a given website and implemented, for example, using JavaScript or another suitable browser-based technology to render, for example, the masked watermarks and/or complement watermarks described herein.

The functionalities disclosed herein can optionally be incorporated into a variety of different software applications and systems, including applications for semiconductor processing, applications for semiconductor analysis and applications for semiconductor evaluation to name a few examples. The functionalities disclosed herein can additionally or alternatively leverage services provided by separate software applications and systems.

The computer software processing disclosed herein may include a number of different modules, sub-modules, or other components of distinct functionality, and can provide information to, or receive information from, still other components and services. These modules can be used, for example, to communicate with input/output devices such as a display screen, a touch sensitive surface, auditory interface, an imaging device (e.g. a digital camera), or any other suitable input/output device. Other components and functionality not reflected in the illustrations will be apparent in light of this disclosure, and it will be appreciated that the present disclosure is not intended to be limited to any particular hardware or software configuration. Thus, in other embodiments, the processing components described herein may include additional, fewer, or alternative subcomponents. Furthermore, in some cases, one or more of the modules and components described herein may be downloaded from a server computing system onto a user device (e.g. a semiconductor processing tool) for local execution.

In alternative embodiments, some or all of the processing and modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used in this regard, and that the present disclosure is not intended to be limited to any particular system architecture.

As will be further appreciated in light of this disclosure, for this and other processes and methods disclosed herein, the functions performed in the processes and methods may be implemented in differing order. Additionally, or alternatively, two or more operations may be performed at the same time or otherwise in an overlapping contemporaneous fashion. Furthermore, the outlined actions and operations are only provided as examples, and some of the actions and operations may be optional, combined into fewer actions and operations, or expanded into additional actions and operations without detracting from the essence of the disclosed embodiments.

Referring now to FIG. 1, an example process 100 for analyzing semiconductor device performance during a semiconductor fabrication process is shown. As depicted, process 100 is initiated and, at 102, a series of specific semiconductor properties on one or more partially completed semiconductor devices are measured. These measurements may be made using a tool configured to obtain simultaneous measurements of layer and photoluminescence properties of partially fabricated semiconductor device samples. Measuring of specific semiconductor properties is further described below at least in conjunction with FIGS. 2 and 3. It should be appreciated that measurements may be made on multiple partially completed semiconductor devices. Thus, concurrent processing of multiple semiconductor processes is possible.

At 104, the semiconductor property data (the measured semiconductor parameters) are provided to one or more device models. These models include a course device model that generates a course prediction of semiconductor device performance, a medium device model that generates a medium prediction of semiconductor device performance, and/or a fine device model that generates a fine prediction of semiconductor device performance.

At 106, the model(s) (the models to which the semiconductor property data is input) is then applied to the semiconductor property data. In cases where not all necessary property data is provided for the selected model, then additional measurements or simulations may be performed to acquire these properties.

At 108, performance limits (e.g., theoretical performance limits) are predicted via the model(s) for a final, completed semiconductor device. This final, completed semiconductor devices is a device having performance characteristics (e.g., electrical performance characteristics) expected to exist in a fully fabricated semiconductor device based on the measured partially fabricated semiconductor device samples. Prediction of theoretical performance limits is further described below at least in conjunction with FIG. 4.

At 110, a determination is made as to whether the semiconductor device is complete. In other words, a determination is made as to whether the semiconductor device is fully fabricated or whether more fabrications steps (e.g., the deposition of additional semiconductor layers) are required to complete the semiconductor device. The completed semiconductor device architecture may be predefined before the start of the fabrication or manufacturing process or determined during the process. If it is determined that the semiconductor device is complete, process 100 may then end.

Otherwise, if it is determined that the semiconductor device is not complete, it may be determined as to whether the predicted theoretical performance limits are within a range of specified threshold values. These threshold values may be compared to other theoretical models that predict the performance or defined by the user based on experimental or literature values. The threshold values may vary depending on the semiconducting material as well as device geometry used.

If it is determined that the predicted theoretical performance limits are not within the range of specified threshold values, it may be determined that a completed semiconductor device will not satisfy desired performance criteria and processing ,may end even a semiconductor device has not been fully fabricated (i.e., process 100 may end). That is, since the predicted theoretical performance limits are not within the range of threshold values, it may be determined to not continue fabrication of the semiconductor device that is based on the partially fabricated semiconductor device samples.

Otherwise, if it is determined that the predicted theoretical performance limits are within the specified range of threshold values, at 112, it may be optionally determined to perform the next semiconductor fabrication step. For example, the next semiconductor fabrication step may be performed using some or all of the partially fabricated semiconductor device samples used to obtain the semiconductor property data. Additionally, or alternatively, new semiconductor device samples fabricated up to the nest semiconductor fabrication step may be created.

At 114, a determination is made as to whether to measure specific semiconductor properties on the semiconductor device(s) fabricated to the next fabrication step. If it is determined to not measure specific semiconductor properties on the semiconductor device(s) fabricated to the next fabrication step, process 100 may end.

Otherwise, if it is determined to measure specific semiconductor properties on the semiconductor device(s) fabricated to the next fabrication step, the operations of 102-112 may be repeated as necessary to predict the theoretical performance limits.

Figure 2:
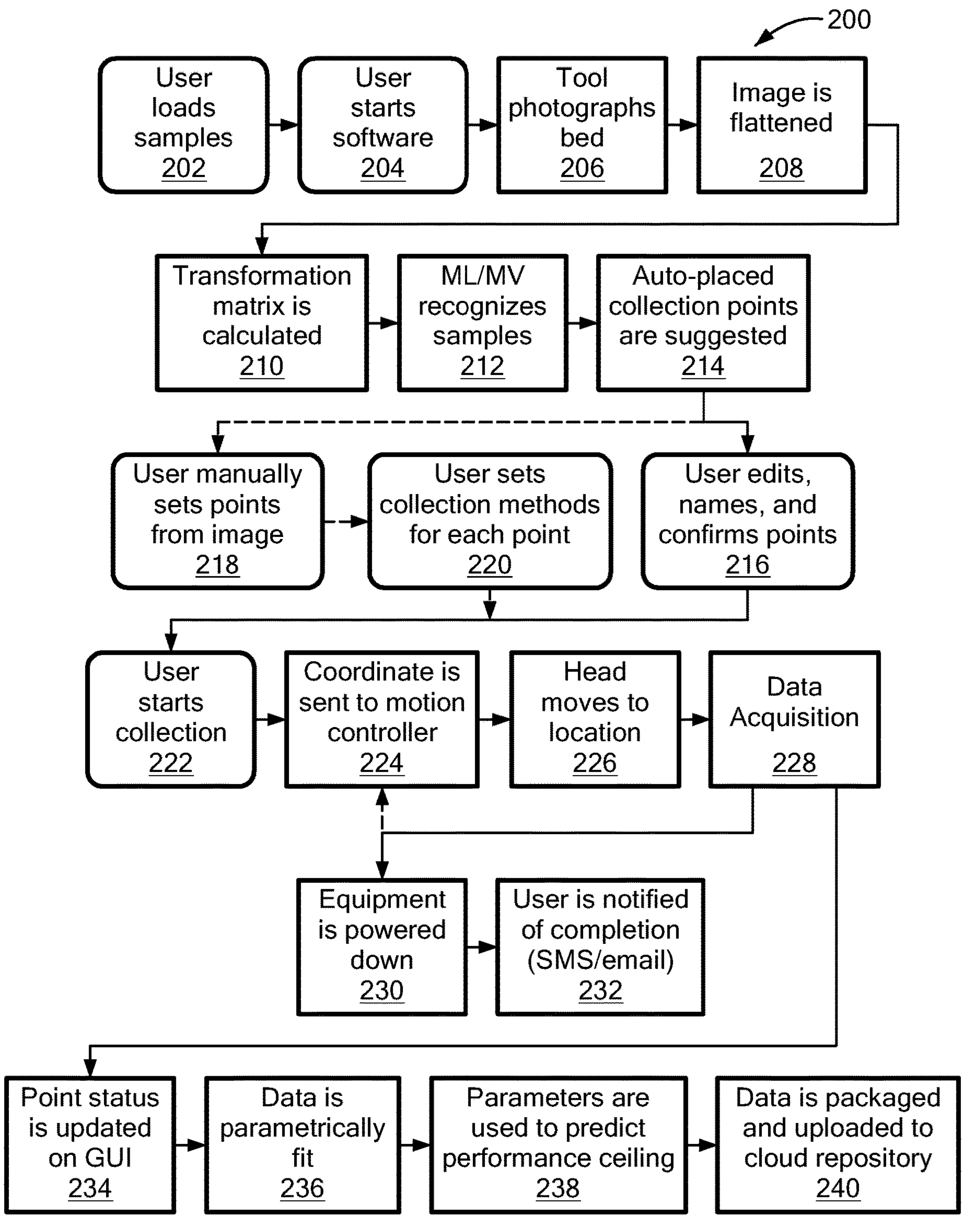
FIG. 2 is a block diagram illustrating an example operational workflow for performing semiconductor device performance modeling based on data acquisition during a semiconductor fabrication process, in accordance with an embodiment of the present disclosure.

FIG. 2 is a block diagram illustrating an example operational workflow 200 for performing semiconductor device performance modeling based on data acquisition during a semiconductor fabrication process, in accordance with an embodiment of the present disclosure. With reference to workflow 200, a user loads 202 one or more samples onto a tool. These samples may be loaded by placing onto a bed of the tool.

The user then starts 204 the application software, sometimes referred to herein more simply as software, that is programmed or otherwise configured to operate the tool. In an implementation, the software can utilize machine vision to identify the loaded samples and suggest or otherwise recommend collection points, which can be manually approved or automatically executed. The software may control the tool to collect numerous optical measurements on one or more samples, grid scans over a single sample, as well as perform imaging such as photoluminescence, electroluminescence, and laser beam induced current (LBIC).

In an implementation, the software may execute or otherwise perform parameter fitting to provide feedback, and in some cases immediate feedback, of semiconductor performance. The information can be displayed in real time, for example via a viewer, such as a user interface, as the data is collected can be viewed using the software by individually opening data points in the viewer or hovering a mouse over points on the sample image during collection. This allows the user to easily correlate the test results to the spatial location on the sample.

With continued reference to workflow 200, the tool photographs 206 the bed and the image (image of the one or more samples on the bed) is flattened 208. The software calculates (210) a transformation matrix and recognizes 212 the one or more samples in the image. In an implementation, the software can use machine learning (ML) and/or machine vision (MV) to recognize the samples. The software then suggests 214 auto-placed collection points. The suggestion may be made to the user via a user interface.

The user can then edit, name (e.g., label) and/or confirm 216 the suggested collection points. Additionally, or alternatively, the user can manually set 218 collection points on the image and, optionally, set or otherwise specify 220 collection methods for the collection points. For instance, the user can specify collection methods for each collection point.

In any case, once the collection points and collection methods are set, the user starts 222 the collection process, and the software sends 224 coordinate data to the motion controller component of the tool. In response to receiving the coordinate data, the tool head moves 226 to the location specified by the coordinate data, and data acquisition 228 is performed. Data acquisition 228 is further described below at least in conjunction with FIG. 3.

Once data acquisition 228 is complete, the software can power down 230 the tool, and provide a notification 232 of the completion of the data acquisition. For example, the software may notify the user of the completion of the data acquisition via the user interface, a text message (e.g., short message service (SMS) message), and/or an email. In cases where there is additional coordinate data to process, the tool is not powered down and the software can send 224 the additional coordinate data to the motion controller component of the tool and additional data can be acquired.

In some embodiments, subsequent to data acquisition 228, the software can update 234 the point on the user interface to reflect the completed status of the point, and make collected data available to view, and parametrically fit 236 the data using known numerical methods to extract the constants for the appropriate descriptive behavioral equation from the collected data.

The parametrically fit parameters can then be used to predict 238 a performance ceiling of a completed semiconductor device. For example, these parameters may be input to one or more device models that predict the theoretical performance limits of a fully fabricated semiconductor device. The predictive modeling of fully fabricated semiconductor devices is further described below at least in conjunction with FIG. 4.

Once the prediction is complete, the software can package and upload 240 the data representing the predicted theoretical performance limits to a repository, such as, for example, a cloud repository.

Figure 3:
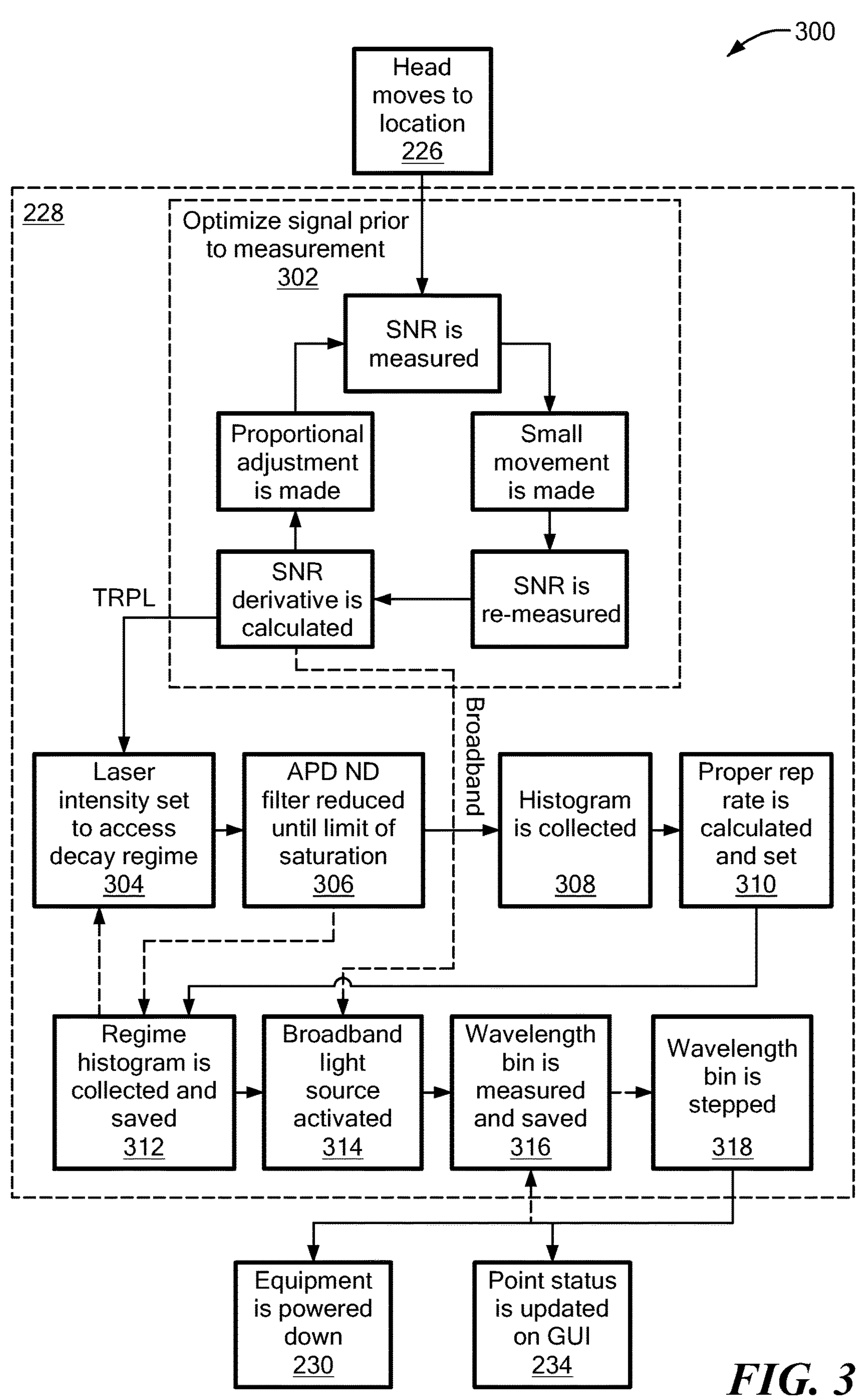
FIG. 3 is a block diagram illustrating an example process for the data acquisition operation of the example workflow of FIG. 2, in accordance with an embodiment of the present disclosure.

FIG. 3 is a block diagram illustrating an example process 300 for data acquisition 228 of example workflow 200 of FIG. 2, in accordance with an embodiment of the present disclosure. As described previously, data acquisition 228 can be performed subsequent to the tool head moving 226 to the location specified by the coordinate data provided by the software.

With reference to data acquisition 228 and as can be seen in FIG. 3, a signal optimization 302 can be performed prior to conducting any measurements. The optimization may include measuring the signal-to-noise ratio (SNR) of a signal, making a small adjustment to the head (adjusting the location of the signal), remeasuring the SNR, and calculating an SNR derivative. If it is determined from the calculated SNR derivative that further adjustments are required, then a proportional adjustment to the signal is made, and the signal optimization process is repeated.

Otherwise, if it is determined from the calculated SNR derivative that the signal is optimized, then, the laser intensity is set 304 to access decay regime, and a neutral density (ND) filter placed over input of an avalanche photodiode (APD) is reduced 306 until the APD limit of saturation is reached. Once the filter is reduced 306, if the repetition rate had not been set, a histogram is collected 308, and the repetition rate is calculated by measuring the time taken for photoluminescence to return to baseline level after incident light pulse and setting rep rate to a scaled time of that measurement 310. After the repetition has been set or after the APD ND filter has been reduced and the repetition rate did not need to be set, a histogram is collected and stored for the decay regime currently accessed by laser intensity. At this point the laser intensity can be adjusted to access a different decay regime 304 and additional histograms collected and saved 312

Subsequent to collecting and saving 312 the regime histogram, the broadband light source is activated 314. As described previously, the broadband light source can be used to collect the transmission and reflection spectra. Once the broadband light source is activated 314, a wavelength bin is measured and saved 316, and the wavelength bin is stepped 318 in the case that the measurement device can only collect in one frequency bin at a time. Once the wavelength bin is stepped 318, the stepped wavelength bin can be measured and saved 316.

Figure 4:
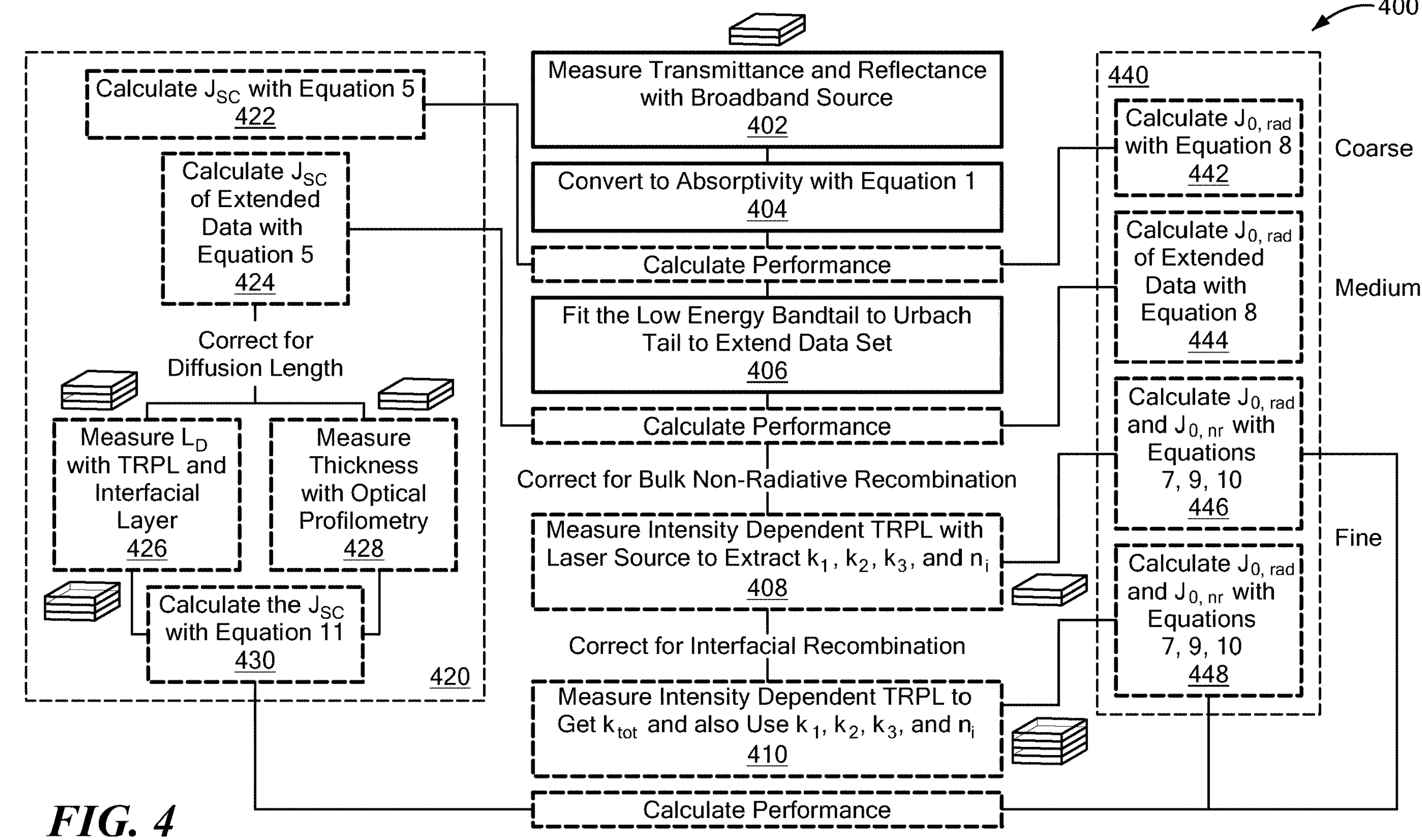
FIG. 4 is a block diagram illustrating an example semiconductor device performance modeling process of the example workflow of FIG. 2, in accordance with an embodiment of the present disclosure.

FIG. 4 is a block diagram illustrating an example semiconductor device performance modeling process 400 of example workflow 200 of FIG. 2, in accordance with an embodiment of the present disclosure. More specifically, FIG. 4 illustrates a workflow for predicting the theoretical performance of solar cells using course, medium, and fine models to generate predictions ranging from course to fine predictions. However, the illustrated performance modeling process is not limited to solar cells. In a more general sense, the illustrated performance modeling process can also be applied to other types of optoelectronic devices, such as LEDs, integrated circuits, photodetectors, and lasers, and this disclosure should not be construed as limited in this regard.

With reference to process 400, transmittance and reflectance on one or more partially fabricated solar cell samples are measured 402 using a broadband light source, such as white light. The collected data sets of transmission and reflection spectra collected are then converted 404 to absorptivity using Equation 1 above. The calculated absorptivity spectrum, a(E), can then be used to determine a short circuit current density 420 and determine a current voltage relationship 440.

A course prediction of the short circuit current density 422 on the measured samples can then be determined using the absorptivity spectrum to calculate $J_{SC}$ with Equation 5 above. As for the current voltage relationship, a course prediction of the current voltage relationship 442 on the measured samples can be determined using the absorptivity spectrum to calculate $J_{0,rad}$ with Equation 8 above. The course predictions of the short circuit current density and the current voltage relationship can then be used to predict the theoretical performance limits of a fully fabricated solar cell that would have been created based on the one or more samples. For example, the theoretical performance limits can be determined by calculating a JV curve.

For the medium models, a low energy bandtail of the absorptivity spectrum may be fitted 406 to extrapolate the data below the measurement noise floor. Bandtails can be either of exponential Gaussian in form with a parameter used to quantify the extent of electronic disorder or broadening in the light-absorbing material system. The extrapolated data can be terminated when the absorptivity has reached a certain value or when the extended data does not significantly change the integrated current densities past a certain precision. The generated extended data set can then be used to determine medium predictions of the short circuit current density and the current voltage relationship.

A medium prediction of the short circuit current density 424 on the measured samples can then be determined using the extended data set to calculate $J_{SC}$ with Equation 5 above. As for the current voltage relationship, a medium prediction of the current voltage relationship 444 on the measured samples can be determined using the extended data set to calculate $J_{0,rad}$ with Equation 8 above. The medium predictions of the short circuit current density and the current voltage relationship can then be used to predict the theoretical performance limits of a fully fabricated solar cell that would have been created based on the one or more samples. For example, the theoretical performance limits can be determined by calculating a JV curve.

For the fine models, the extended data sets may be analyzed to extract the necessary semiconductor parameters. For example, with respect to short circuit current density, diffusion length ($L_D$) on the samples may be measured 426 with TRPL and interfacial layer to correct for diffusion length. Also, thickness of the samples may be measured 428 with optical profilometry. With respect to current voltage relationship, to correct for bulk non-radiative recombination, intensity dependent TRPL on the samples may be measured 408 with a laser source to extract $k_1$, $k_2$, $k_3$, and $n_i$. In some embodiments, $k_{tot}$ may also be extracted 410 to correct for interfacial recombination.

A fine prediction of the short circuit current density 430 on the measured samples can then be determined using the measured $L_D$ and sample thicknesses to calculate $J_{SC}$ with Equation 11 above. As for the current voltage relationship, a fine prediction of the current voltage relationship 446 on the measured samples can be determined using the measured $k_1$, $k_2$, $k_3$, $n_i$, or any combination thereof, to calculate $J_{0,rad}$ and $J_{0,nr}$ with Equations 7, 9, and 10 above. In some embodiments, a fine prediction of the current voltage relationship 448 on the measured samples can be determined using the measured $k_{tot}$ and $k_1$, $k_2$, $k_3$, $n_i$, or any combination thereof, to calculate $J_{0,rad}$ and $J_{0,nr}$ with Equations 7, 9, and 10 above. The fine predictions of the short circuit current density and the current voltage relationship can then be used to predict the theoretical performance limits of a fully fabricated solar cell that would have been created based on the one or more samples. For example, the theoretical performance limits can be determined by calculating a JV curve.

It will be appreciated in light of this disclosure that any combination of predicted short circuit current density and predicted current voltage relationship may be used to predict the theoretical performance limits of a fully fabricated solar cell. For example, a fine prediction of the short circuit current density and a course prediction of the current voltage relationship can be used to predict the theoretical performance limits. As another example, a course prediction of the short circuit current density and a fine prediction of the current voltage relationship can be used to predict the theoretical performance limits. Other combinations will be readily apparent in light of this disclosure.

Figure 5:
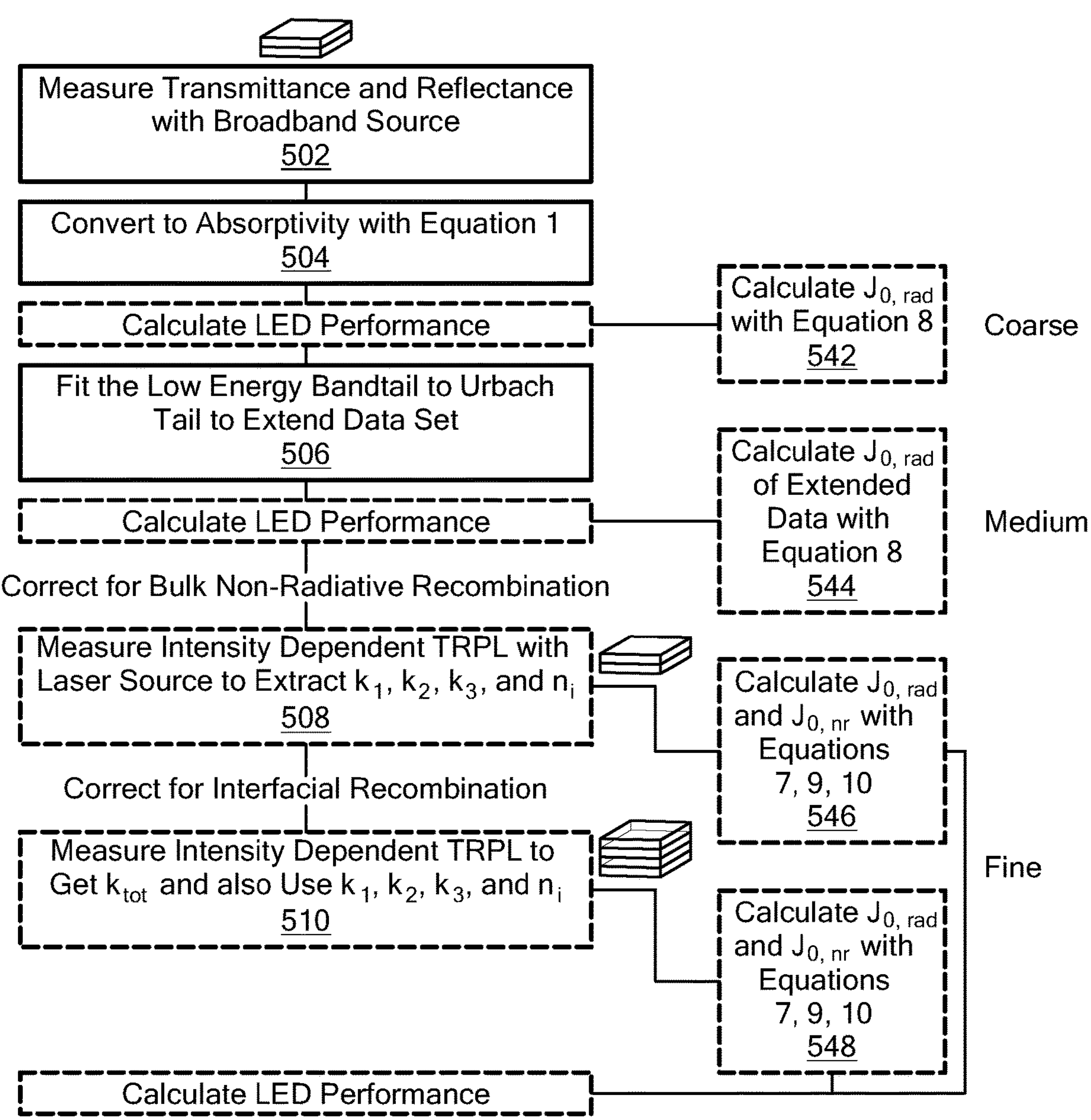
FIG. 5 is a block diagram illustrating another example semiconductor device performance modeling process of the example workflow of FIG. 2, in accordance with an embodiment of the present disclosure.

FIG. 5 is a block diagram illustrating an example semiconductor device performance modeling process 500 of the example workflow of FIG. 2, in accordance with an embodiment of the present disclosure. More specifically, FIG. 5 illustrates a workflow for predicting the theoretical performance of LEDs using course, medium, and fine models to generate predictions ranging from course to fine predictions.

With reference to process 500, transmittance and reflectance on one or more partially fabricated LED samples are measured 502 using a broadband light source, such as white light. The collected data sets of transmission and reflection spectra collected are then converted 504 to absorptivity using Equation 1 above. The calculated absorptivity spectrum, a(E), can then be used to determine a current voltage relationship. Note that, different from solar cells, a short circuit current density is not required.

A course prediction of the current voltage relationship 542 on the measured samples can be determined using the absorptivity spectrum to calculate $J_{0,rad}$ with Equation 8 above. The course prediction of the current voltage relationship can then be used to predict the theoretical performance limits of a fully fabricated LED that would have been created based on the one or more samples. For example, the theoretical performance limits can be determined by calculating, for example, an electroluminescence spectrum, quantum efficiency, and/or power efficiency and luminance.

For the medium model, a low energy bandtail of the absorptivity spectrum may be fitted 506 to extrapolate the data below the measurement noise floor. Bandtails can be functions in the form of exponential or Gaussian distributions with a parameter used to quantify the extent of electronic disorder or broadening in the light-absorbing material system. The extrapolated data can be terminated when the absorptivity has reached a certain value or when the extended data does not significantly change the integrated current densities past a certain precision. The generated extended data set can then be used to determine medium predictions of the short circuit current density and the current voltage relationship.

A medium prediction of the current voltage relationship 544 on the measured samples can be determined using the extended data set to calculate $J_{0,rad}$ with Equation 8 above. The medium prediction of the current voltage relationship can then be used to predict the theoretical performance limits of a fully fabricated LED that would have been created based on the one or more samples. As described previously, the theoretical performance limits can be determined by calculating, for example, an electroluminescence spectrum, quantum efficiency, and/or power efficiency and luminance.

For the fine model, to correct for bulk non-radiative recombination, intensity dependent TRPL on the samples may be measured 508 with a laser source to extract $k_1$, $k_2$, $k_3$, and $n_i$. In some embodiments, $k_{tot}$ may also be extracted 510 to correct for interfacial recombination.

A fine prediction of the current voltage relationship 546 on the measured samples can be determined using the measured $k_1$, $k_2$, $k_3$, $n_i$, or any combination thereof, to calculate $J_{0,rad}$ and $J_{0,nr}$ with Equations 7, 9, and 10 above. In some embodiments, a fine prediction of the current voltage relationship 548 on the measured samples can be determined using the measured $k_{tot}$ and $k_1$, $k_2$, $k_3$, $n_i$, or any combination thereof, to calculate $J_{0,rad}$ and $J_{0,nr}$ with Equations 7, 9, and 10 above. The fine prediction of the current voltage relationship can then be used to predict the theoretical performance limits of a fully fabricated LED that would have been created based on the one or more samples. As described previously, the theoretical performance limits can be determined by calculating, for example, an electroluminescence spectrum, quantum efficiency, and/or power efficiency and luminance.

Figure 6:
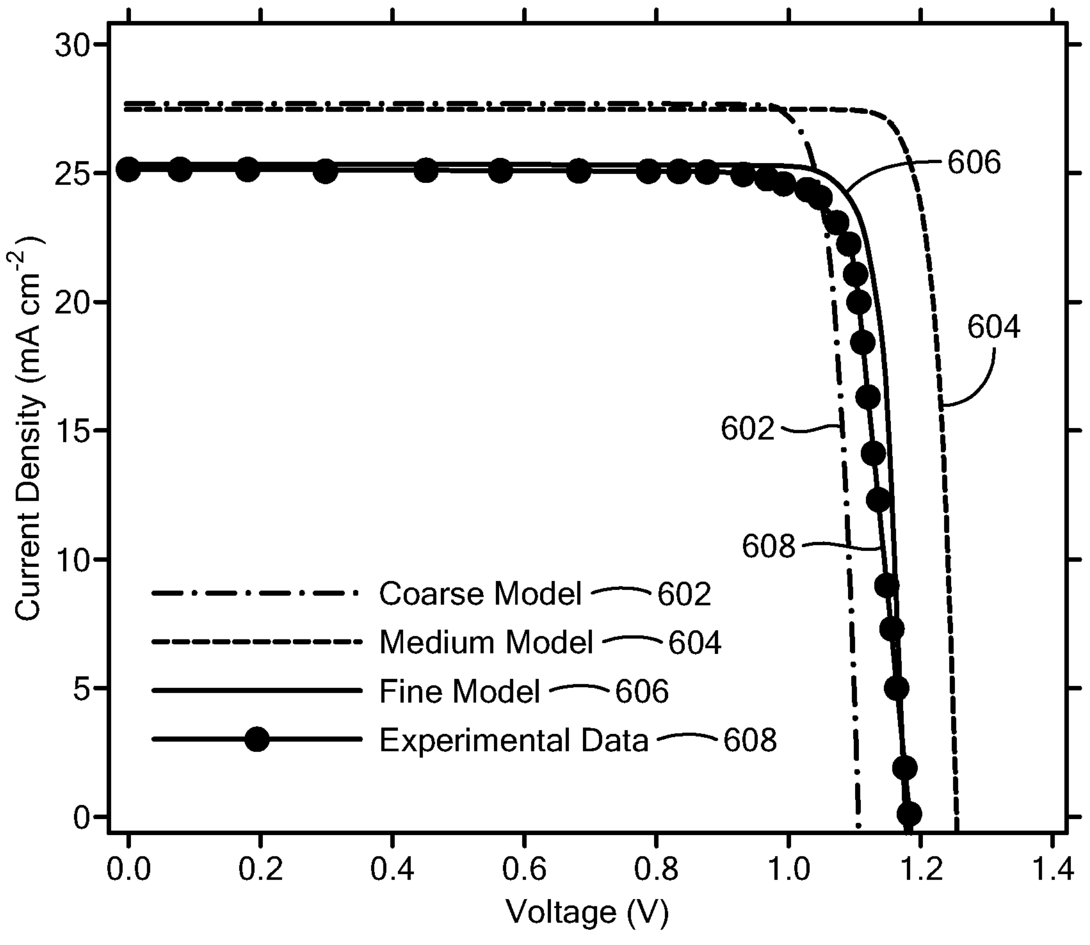
FIG. 6 is a plot showing simulated current voltage (JV) curves using course, medium, and fine device models.

FIG. 6 is a plot showing simulated current voltage (JV) curves using course, medium, and fine device models. As can be seen, FIG. 6 shows simulated current voltage (JV) curves using the course model (indicated by reference numeral 602), the medium model (indicated by reference numeral 604), and the fine model (indicated by reference numeral 606) compared to the experimental data (indicated by reference numeral 608). The simulation was performed using data sets obtained from partially fabricated semiconductor device samples.

Quantitatively, JV curves 602, 604, 606 were calculated using the measured data sets (e.g., transmittance and reflectance spectra, steady state PL spectrum, time-resolved PL decay trace, intensity dependent time-resolved PL at low, medium, and high laser intensities along with global fits to the data, and reduced Chi-squared surface plot (i.e., error)) and using the fitted semiconductor parameters input into Equations 4-11. As can be seen in FIG. 6, the fine model predicts the JV curve (indicated by reference numeral 606) having the most accuracy to the experimental data (indicated by reference numeral 608).

Figure 7B:
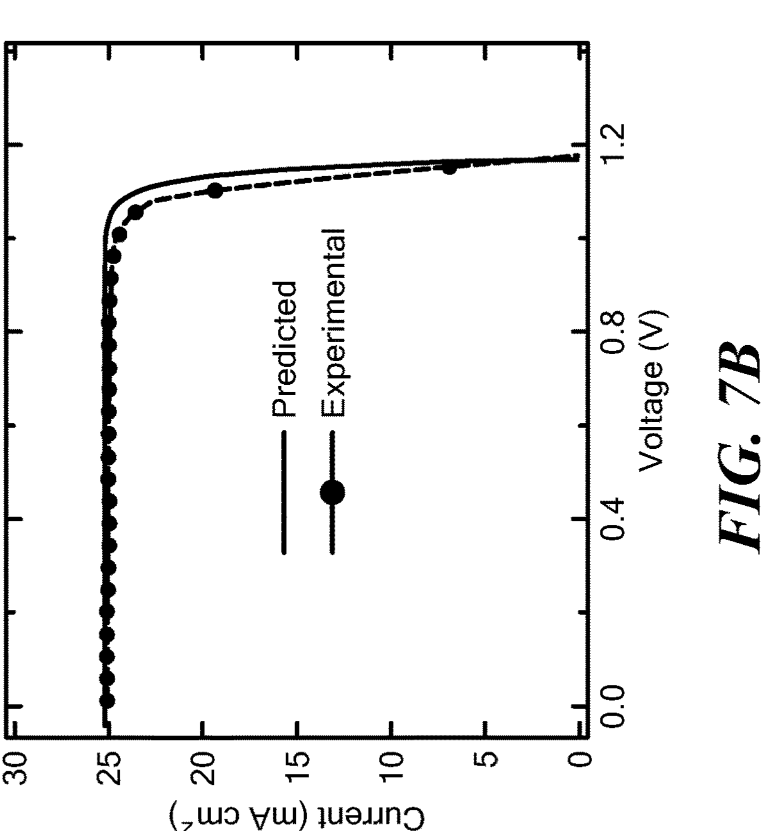
FIG. 7B is a plot showing a predicted current voltage (JV) curve of a solar obtained from three layers of the device stack versus the curve of the full device with six total layers.
Figure 7A:
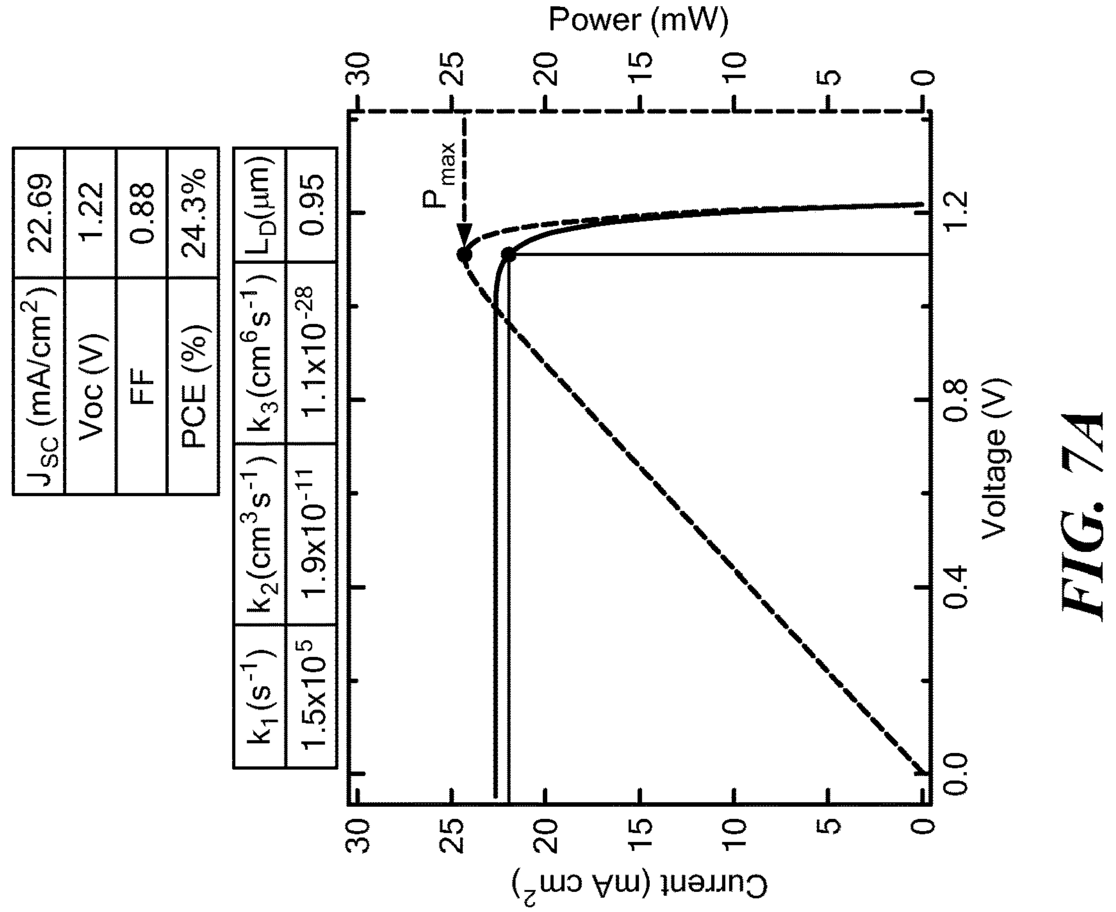
FIG. 7A is a plot showing a simulated current voltage (JV) curve of a solar cell considering the real optical response of the device as well as measured semiconductor parameters such as the recombination rate constants and diffusion length.

FIG. 7A is a plot showing a simulated current voltage (JV) curve of a solar cell considering the real optical response of the device as well as measured semiconductor parameters such as the recombination rate constants and diffusion length. As can be seen, using this curve, the power at maximum achievable power point ($P_{max}$) can be determined as well as commonly reported photovoltaic parameters such as the open circuit voltage ($V_{oc}$) and fill factor (FF).

FIG. 7B is a plot showing a predicted current voltage (JV) curve of a solar obtained from three layers of the device stack versus the curve of the full device with six total layers. Surprisingly, as can be seen, there is excellent agreement between the theoretical prediction and experimentally measured device. This suggests that the three measured layers, which include the electron-transport layer, semiconducting layer, and hole transport layer, may dominate the overall device performance. It will be appreciated in light of this disclosure that predicting device performance only after three fabrication steps represents a new benchmark in how devices are traditionally optimized and it avoids the thermal evaporation of a metal electrode, which often accounts for >50% of the device fabrication time.

Note that, although the JV curves in FIGS. 6, 7A, and 7B were calculated using data sets obtained from partially fabricated semiconductor devices having three layers of the full device stack, the theoretical performance can be predicted after any of the fabrication steps. For instance, as noted above, the data sets used in calculating the JV curves may be obtained after the deposition of the photoactive layer as well as after the deposition of any additional layers on top or below the semiconducting material.

Figures 8A, 8B, 8C:
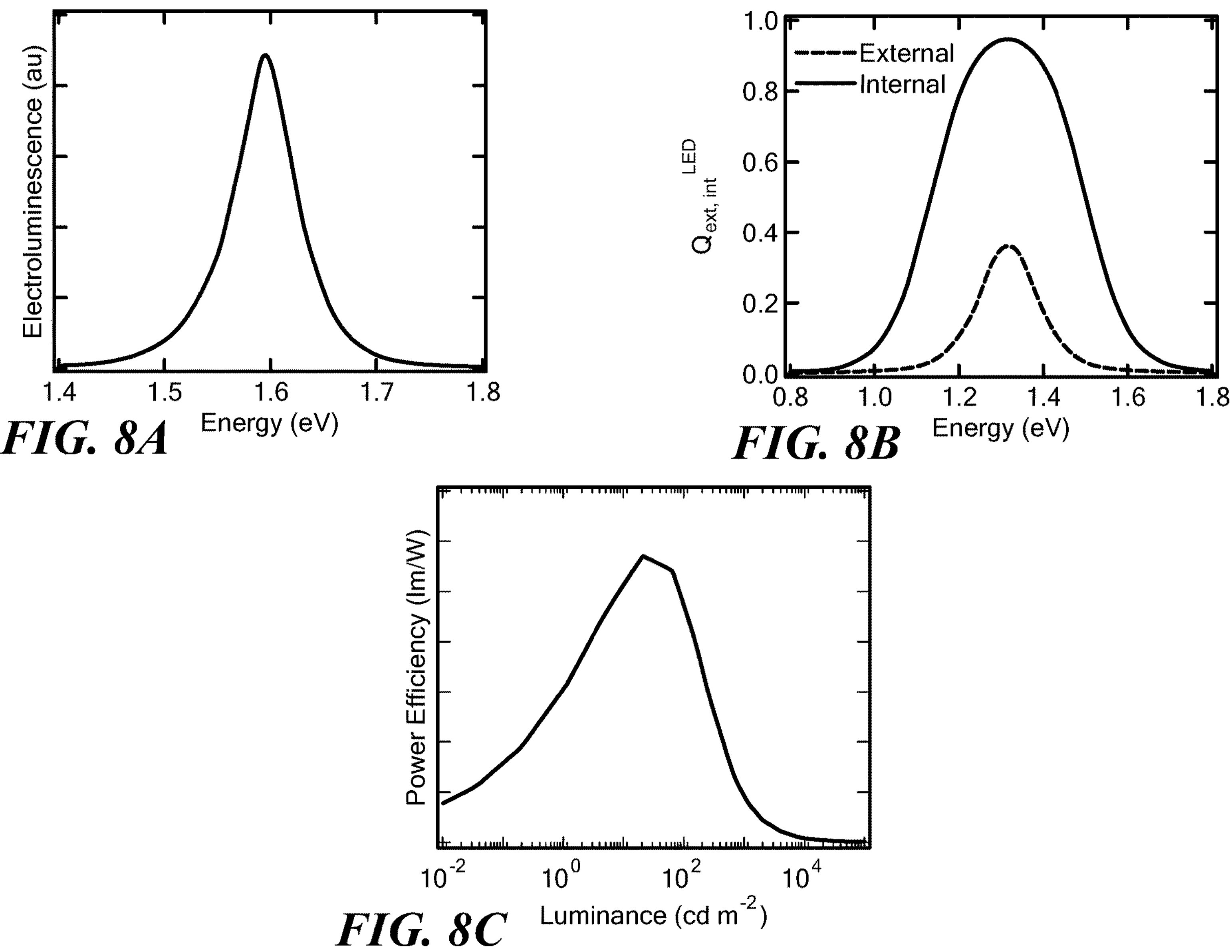
FIG. 8A is a plot showing a simulated electroluminescence (EL) spectrum of a light-emitting diode (LED).
FIG. 8B is a plot showing internal and external quantum efficiency $(Q_{ext,int}^{LED})$ of a light-emitting diode (LED) as a function of injected voltage.
FIG. 8C is a plot showing power efficiency of a light-emitting diode (LED) as a function of LED luminance.

FIG. 8A is a plot showing a simulated electroluminescence (EL) spectrum of a light-emitting diode (LED) using the extended data method described above.

FIG. 8B is a plot showing internal (indicated by the solid line) and external (indicated by the dashed line) quantum efficiency $$(Q_{ext}^{LED})$$

of a light-emitting diode (LED) as a function of injected voltage. The difference in the values is determined by the geometry of the device and photon escape probability.

FIG. 8C is a plot showing power efficiency of a light-emitting diode (LED) as a function of LED luminance. This is a practical figure of merit of light emitting devices which takes into the response of the human eye.

The processes described herein may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a non-transitory machine-readable medium or another article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product (e.g., in a non-transitory machine-readable storage medium such as, for example, a non-transitory computer-readable medium) for execution by, or to control the execution of, data processing apparatus (e.g., a programmable processor, a computer, or multiple computers). Each such program may be implemented in a high-level procedural, functional, or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed one computer or multiple computers at one site or distributed across multiple sites and interconnected by a communication network. A computer program may be stored on a non-transitory machine-readable medium or device that is readable by a general or special purpose programmable computer for configuring and operating the computer when the non-transitory machine-readable medium or device is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disk, flash memory, non-volatile memory, volatile memory, magnetic diskette, and so forth but does not include a transitory signal per se.

As will be further appreciated in light of this disclosure, with respect to the processes and methods disclosed herein, the functions performed in the processes and methods may be implemented in differing order. Additionally, or alternatively, two or more operations may be performed at the same time or otherwise in an overlapping contemporaneous fashion. Furthermore, the outlined actions and operations are only provided as examples, and some of the actions and operations may be optional, combined into fewer actions and operations, or expanded into additional actions and operations without detracting from the essence of the disclosed embodiments.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include an indirect "connection" and a direct "connection".

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description herein, the terms "upper," "lower," "right," "left," "vertical," "horizontal, "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary layers or structures at the interface of the two elements.

In the description of the various embodiments, reference is made to the accompanying drawings identified above and which form a part hereof, and in which is shown by way of illustration various embodiments in which aspects of the concepts described herein may be practiced. It is to be understood that other embodiments may be utilized, and structural and functional modifications may be made without departing from the scope of the concepts described herein. It should thus be understood that various aspects of the concepts described herein may be implemented in embodiments other than those specifically described herein. It should also be appreciated that the concepts described herein are capable of being practiced or being carried out in ways which are different than those specifically described herein.

Terms used in the present disclosure and in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, such recitation should be interpreted to mean at least the recited number (e.g., the bare recitation of "two widgets," without other modifiers, means at least two widgets, or two or more widgets). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

It is to be understood that the phraseology and terminology used herein are for the purpose of description and should not be regarded as limiting. Rather, the phrases and terms used herein are to be given their broadest interpretation and meaning. The use of "including" and "comprising" and variations thereof is meant to encompass the items listed thereafter and equivalents thereof as well as additional items and equivalents thereof. The use of the terms "connected," "coupled," and similar terms, is meant to include both direct and indirect, connecting, and coupling.

All examples and conditional language recited in the present disclosure are intended for pedagogical examples to aid the reader in understanding the present disclosure, and are to be construed as being without limitation to such specifically recited examples and conditions. Although example embodiments of the present disclosure have been described in detail, various changes, substitutions, and alterations could be made hereto without departing from the spirit and scope of the present disclosure. Accordingly, it is intended that the scope of the present disclosure be limited not by this detailed description, but rather by the claims appended hereto.

What is claimed is:

1. A method comprising:

receiving a plurality of measured semiconductor properties of one or more partially completed semiconductor devices;

determining a measure of short circuit current density ($J_{SC}$) of each of the one or more partially completed semiconductor devices, the $J_{SC}$ measure based on a measure of semiconductor diffusion length ($L_D$) and a measure of thickness;

determining a current voltage relationship of each of the one or more partially completed semiconductor devices;

calculating a current voltage (JV) curve based on the $J_{SC}$ measure and the current voltage relationship of each of the one or more partially completed semiconductor devices, wherein the JV curve provides an indication of maximum achievable power point ($P_{max}$) and open circuit voltage ($V_{oc}$) of a semiconductor device completed from the one or more partially completed semiconductor devices;

determining a predicted performance characteristic of the semiconductor device; and in response to the predicted performance characteristic being within a range of threshold values, completing fabrication of the semiconductor device.

2. The method of claim 1, wherein the plurality of measured semiconductor properties comprises an absorptivity spectrum determined from a measure of transmittance and reflectance.

3. The method of claim 2, further comprising, fitting a low energy bandtail of the absorptivity spectrum to extrapolate the data below the measurement noise floor.

4. The method of claim 1, wherein the current voltage relationship includes a measure of radiative saturation current density ($J_{0,rad}$) of each of the one or more partially completed semiconductor devices.

5. The method of claim 4, wherein the $J_{0,rad}$ measure is based on an extended data set comprised of two or more data sets.

6. The method of claim 1, wherein the current voltage relationship includes a measure of radiative saturation current density ($J_{0,rad}$) and a measure of non-radiative current density ($J_{0,nr}$) of each of the one or more partially completed semiconductor devices.

7. The method of claim 6, wherein the measure of $J_{0,rad}$ and the measure of $J_{0,nr}$ are based on a first-order, non-radiative recombination rate constant ($k_1$), a second-order, radiative recombination rate constant ($k_2$), a third-order, non-radiative recombination rate constant ($k_3$), an intrinsic carrier density ($n_i$), or any combination thereof.

8. The method of claim 7, wherein the measure of $J_{0,rad}$ and the measure of $J_{0,nr}$ are further based on a total non-radiative recombination rate constant ($k_{tot}$).

9. The method of claim 1, further comprising, in response to the predicted performance characteristic not being within the range of threshold values, stopping fabrication of the semiconductor device.

10. A method comprising:

receiving a plurality of measured semiconductor properties of one or more partially completed semiconductor devices;

determining a measure of short circuit current density ($J_{SC}$) of each of the one or more partially completed semiconductor devices;

determining a current voltage relationship of each of the one or more partially completed semiconductor devices, wherein the current voltage relationship includes a measure of radiative saturation current density ($J_{0,rad}$) and a measure of non-radiative current density ($J_{0,nr}$) of each of the one or more partially completed semiconductor devices;

calculating a current voltage (JV) curve based on the $J_{SC}$ measure and the current voltage relationship of each of the one or more partially completed semiconductor devices, wherein the JV curve provides an indication of maximum achievable power point ($P_{max}$) and open circuit voltage ($V_{oc}$) of a semiconductor device completed from the one or more partially completed semiconductor devices;

determining a predicted performance characteristic of the semiconductor device; and in response to the predicted performance characteristic being within a range of threshold values, completing fabrication of the semiconductor device.

11. The method of claim 10, wherein the plurality of measured semiconductor properties comprises an absorptivity spectrum determined from a transmittance and reflectance measure.

12. The method of claim 10, further comprising, fitting a low energy bandtail of the absorptivity spectrum to extrapolate the data below the measurement noise floor.

13. The method of claim 10, wherein the measure of $J_{0,rad}$ and the measure of $J_{0,nr}$ are based on a first-order, non-radiative recombination rate constant ($k_1$), a second-order, radiative recombination rate constant ($k_2$), a third-order, non-radiative recombination rate constant ($k_3$), an intrinsic carrier density ($n_i$), or any combination thereof.

14. The method of claim 13, wherein the measure of $J_{0,rad}$ and the measure of $J_{0,nr}$ are further based on a total non-radiative recombination rate constant ($k_{tot}$).

15. The method of claim 10, wherein the $J_{0,rad}$ measure is based on an extended data set comprised of two or more data sets.

16. The method of claim 10, wherein the $J_{SC}$ measure is based on a measure of semiconductor diffusion length ($L_D$) and a measure of thickness.

17. The method of claim 10, further comprising, in response to the predicted performance characteristic not being within the range of threshold values, stopping fabrication of the semiconductor device.

* * * * *